(12) United States Patent
Schravendeel et al.

(10) Patent No.: US 8,258,611 B2
(45) Date of Patent: Sep. 4, 2012

(54) LEADFRAME STRUCTURE FOR ELECTRONIC PACKAGES

(75) Inventors: Ronald Schravendeel, Beuningen (NL); Peter Schelwald, Nijmegen (NL)

(73) Assignee: NXP B.V., Eindhoven (NL)

( * ) Notice: Subject to any disclaimer, the term of this patent is extended or adjusted under 35 U.S.C. 154(b) by 274 days.

(21) Appl. No.: 12/669,338

(22) PCT Filed: Jul. 15, 2008

(86) PCT No.: PCT/IB2008/052835
§ 371 (c)(1),
(2), (4) Date: Jan. 15, 2010

(87) PCT Pub. No.: WO2009/013665
PCT Pub. Date: Jan. 29, 2009

(65) Prior Publication Data
US 2010/0200973 A1      Aug. 12, 2010

(30) Foreign Application Priority Data
Jul. 23, 2007   (EP) .................................... 07112932

(51) Int. Cl.
*H01L 23/495*   (2006.01)
(52) U.S. Cl. ................................. 257/676; 257/E23.031
(58) Field of Classification Search .................. 257/676, 257/E23.031
See application file for complete search history.

(56) References Cited

U.S. PATENT DOCUMENTS

| | | | |
|---|---|---|---|
| 4,534,105 | A | 8/1985 | Reusch |
| 4,829,362 | A | 5/1989 | Tran et al. |
| 5,763,945 | A | 6/1998 | Corisis et al. |
| 5,859,387 | A | 1/1999 | Gagnon |
| 6,843,059 | B2 | 1/2005 | Burrus et al. |
| 7,064,420 | B2 * | 6/2006 | Han et al. ...................... 257/669 |
| 2004/0061204 | A1 | 4/2004 | Han et al. |
| 2004/0238921 | A1 | 12/2004 | Lee et al. |
| 2005/0263861 | A1 | 12/2005 | Ahn et al. |
| 2007/0212903 | A1 | 9/2007 | Punzalan et al. |

FOREIGN PATENT DOCUMENTS

| | | |
|---|---|---|
| CA | 2189733 A1 | 5/1998 |
| DE | 10149318 A1 | 5/2003 |
| EP | 1328023 A2 | 7/2003 |
| JP | 07 045778 A | 2/1995 |
| JP | 11 297918 A | 10/1999 |
| JP | 2002 164496 A | 6/2002 |
| WO | 02069400 A1 | 6/2002 |
| WO | 2004064110 A2 | 7/2004 |
| WO | 2005055320 A1 | 6/2005 |
| WO | 2007007239 A2 | 1/2007 |

* cited by examiner

*Primary Examiner* — Lex Malsawma

(57) ABSTRACT

A leadframe structure for an electronic package is provided, wherein the leadframe structure comprises a die-pad, a barrier area, and a bonding area, wherein the barrier area is arranged between the die-pad and the bonding area, and wherein the barrier area is adapted to electrically connect the die-pad and the bonding area, and is further constructed in such a way that delamination growth between the leadframe structure and a moulding compound fixable to the leadframe structure is reduced.

19 Claims, 3 Drawing Sheets

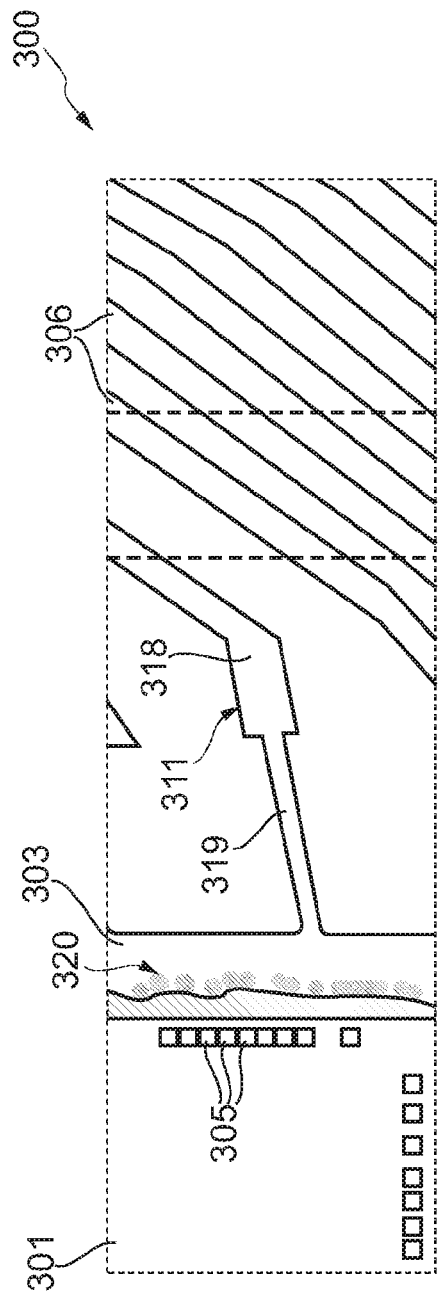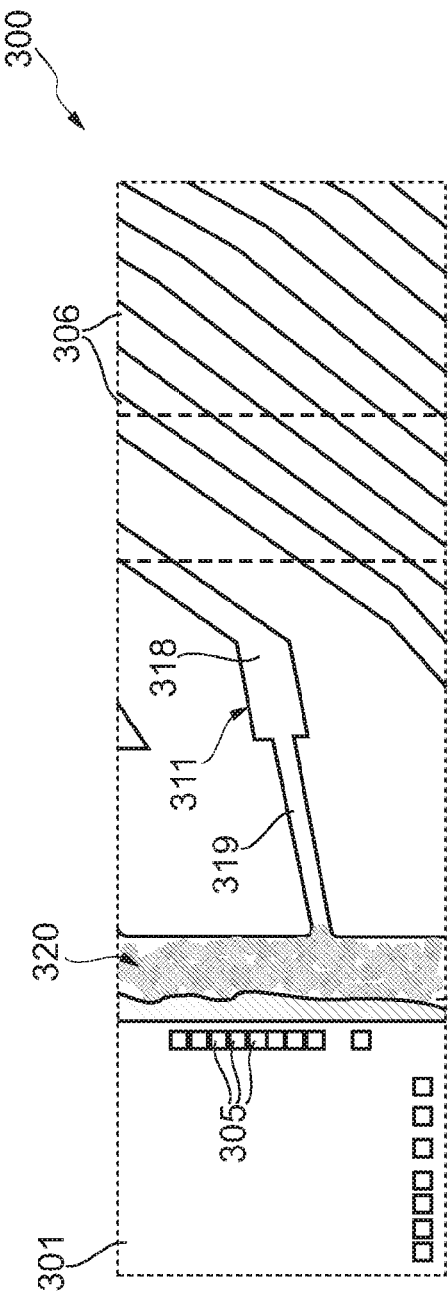

LEADFRAME STRUCTURE FOR ELECTRONIC PACKAGES

FIELD OF THE INVENTION

The invention relates to a leadframe structure for electronic packages.

Moreover, the invention relates to a method of bonding electrical connection, in particular bondwires to a leadframe structure.

Further, the invention relates to an electronic package.

BACKGROUND OF THE INVENTION

In the field of electronic packages, in particular in case that a plastic body encapsulates the chip of the electronic package, carriers or lead frames are widely used. For example, such a lead frame is a metal frame that includes the leads of a plastic encapsulated dual-in-line plastic package. In particular, electronic packages are featured with connection leads penetrating the plastic body surface. Electronic connection from chips of the electronic package to those leads is done by gold (Au) or aluminum (Al) bondwires. In many cases the bondwire is attached to the lead by thermocompression bonding. The inner part is encapsulated by mould compound (EMC). The lead frame holds the leads in place prior to encapsulation and is cut away after encapsulation.

A known problem is the risk of wire bond breakage from the die-pad. Such a wire bond, also referred to as "downbond" is usually made to create an electrical connection from the die surface to the die-pad, which generally forms an electrical ground. Such a downbond has a high risk to come loose from the die-pad when it is used in the final application or during reliability tests.

The die-pad on which the downbond is placed is usually silver-plated to allow wirebonding. The silver-plated surface has a poor adhesion to the moulded compound as used in semiconductor packaging. The die is generally glued on the die-pad, which is a part of the leadframe. The glue-fillet has bad adhesion to the moulding compound, so that during temperature cycling thermo-mechanical stress will cause delamination between moulding compound and leadframe on those locations where adhesion is inferior. The forces driving this delamination increase as the delaminated area grows bigger. The gap height in the delaminated area increases for larger delaminated areas. The delamination and a corresponding gap at the location of the downbond may crack or tear off the bondwire from the die-pad. This will result in electrical failure or performance out of electrical specification.

OBJECT AND SUMMARY OF THE INVENTION

It is an object of the invention to provide a leadframe structure for electronic packages, a method of bonding an electrical connection, and an electronic package, which are less prone to failure or may have increased reliability.

In order to achieve the object defined above a leadframe structure for electronic packages, a method of bonding an electrical connection, and an electronic package according to the independent claims are provided.

According to an exemplary embodiment a leadframe structure for an electronic package is provided, wherein the leadframe structure comprises a die-pad, a barrier area, and a bonding area, wherein the barrier area is arranged between the die-pad and the bonding area, and wherein the barrier area is adapted to electrically connect the die-pad and the bonding area, and is further constructed in such a way that delamination growth between the leadframe structure and a moulding compound fixable to the leadframe structure is reduced.

According to another exemplary embodiment of the leadframe structure the barrier area is formed by a barrier structure that has a width smaller than the bonding area. In particular, the barrier structure may be formed by a barrier structure having a length which is at least two times the width of the barrier structure. Specifically, the length may be more than four times the width.

A metallic conductor or metallic track, e.g. the same material as the material of the die-pad and/or the bonding area, may form the barrier. The width may be measured transversal or lateral to the direction leading from the die-pad to the bonding area. That is, a longitudinal direction of the barrier structure or barrier area may be defined in particular substantially from a contact point of the barrier area and the die-pad and a contact point of the barrier area and the bonding area. Consequently, a width may be defined transversal and in particular perpendicular to that longitudinal direction. By providing a barrier structure having a greater length than width a long and narrow metal connection between die-pad and bonding area or downbond area may be provided which may act as an efficient barrier for growth of delamination.

According to an exemplary embodiment a method of bonding an electrical connection onto a leadframe structure is provided, wherein the method comprises providing a leadframe structure according to an exemplary embodiment, and bonding an electrical connection onto the bonding area. In particular, the electrical connection may be a bondwire.

According to an exemplary embodiment an electronic package comprises a leadframe structure according to an exemplary embodiment, and a die, wherein the die is attached to the die-pad, and wherein the die is further electrically contacted to the bonding area. In particular, the electronic package may further comprise a moulding compound, wherein the moulding compound is formed in such a way that it at least partially covers the leadframe structure and the die. The electronic package may comprise a Quad Flat Package, a Dual In-Line package, or a Small Outline package.

The term "die-pad" may particularly denote an electrically conductive pad which may be adapted to be attached to a die or that a die is bondable to the die-pad. For example, the die may be glued to the die-pad. The die-pad may be electrically connected to ground.

The term "bonding area" may particularly denote a pad or contact area which is adapted to be bonded to a bondwire or that a bondwire is bondable to the bonding area. Such a bonding area may in particular be connected or connectable to ground. In principle, such a bonding area may also form a terminal further electrical or electronic components may be attached to.

By providing a barrier area between the bonding area and the die-pad it may be possible to reduce a risk of delamination between a moulding compound and the die pad which delamination would cause a risk of a breaking of bondwires. In particular, it may be possible to stop a delamination which starts at the glue-fillet and which possibly would grow along the interface between the die-pad and the moulding compound and which possibly depends on thermomechanical forces. Thus, the barrier area may form a barrier for the growth of a gap or delamination. In particular, the delamination may grow up to the edge of the die-pad but may not easily grow along the barrier area.

It may be seen as a gist of an exemplary embodiment that a barrier area electrically connect a die-pad and a bonding area of a leadframe structure. The barrier area is adapted to decrease the probability for a delamination of a moulding compound and the die-pad.

Next, further exemplary embodiments of the leadframe structure for electronic packages are described. However, these embodiments also apply to the method of bonding an electrical connection, and the electronic package.

According to another exemplary embodiment of the leadframe structure the bonding area is formed by a fused lead. In particular, the fused lead may be formed by a dummy fused lead.

The term "dummy fused lead" may particularly denote fused leads that are not connected to external ground, i.e. do not extend to the boundary of the leadframe structure. In other words an area between the dummy fused lead and the boundary of the leadframe structure is free of an electrical connection. Thus, the dummy fused leads may be connected to ground via the die-pad but may not have an own external connection to ground.

According to another exemplary embodiment the leadframe structure further comprises a clamping area, which is adapted in such a way that the clamping area is clampable during a bonding step. In particular, the clamping area may be formed in the region of the bonding areas, for example in such a way that the clamping supports the bonding areas during a bonding process. For example, the clamping area may be arranged around the die-pad and may be usable to mechanically support the leads during wirebonding. In general, the leads are clamped close to the leadtips, where wirebonding usually takes place, to possibly avoid bending of the lead, which bending may act as a spring, due to the force and movements of the wirebond capillary.

Next, further exemplary embodiments of the method of bonding an electrical connection are described. However, these embodiments also apply to the leadframe structure for electronic packages, and the electronic package.

According to another exemplary embodiment the method further comprises attaching a die onto the die-pad, and bonding the electrical connection to a terminal of the die. Thus, an electrically conductive connection between a terminal of the die and ground may be established via the bonding wire, the bounding area and the barrier area.

According to another exemplary embodiment the method further comprises clamping a clamping structure to a clamping area of the leadframe structure. In particular, the clamping structure may be clamped to the clamping area before the electrical connection is bonded onto the bonding area.

The aspects and exemplary embodiments defined above and further aspects of the invention are apparent from the examples of embodiment to be described hereinafter and are explained with reference to these examples of embodiment. Features described in connection with an exemplary embodiment or an exemplary aspect may be combined with other exemplary embodiments or exemplary aspects.

BRIEF DESCRIPTION OF THE DRAWINGS

The invention will be described in more detail hereinafter with reference to examples of embodiment but to which the invention is not limited.

FIG. 3 schematically illustrates growing of a delamination.

DESCRIPTION OF EMBODIMENTS

Figure 1:
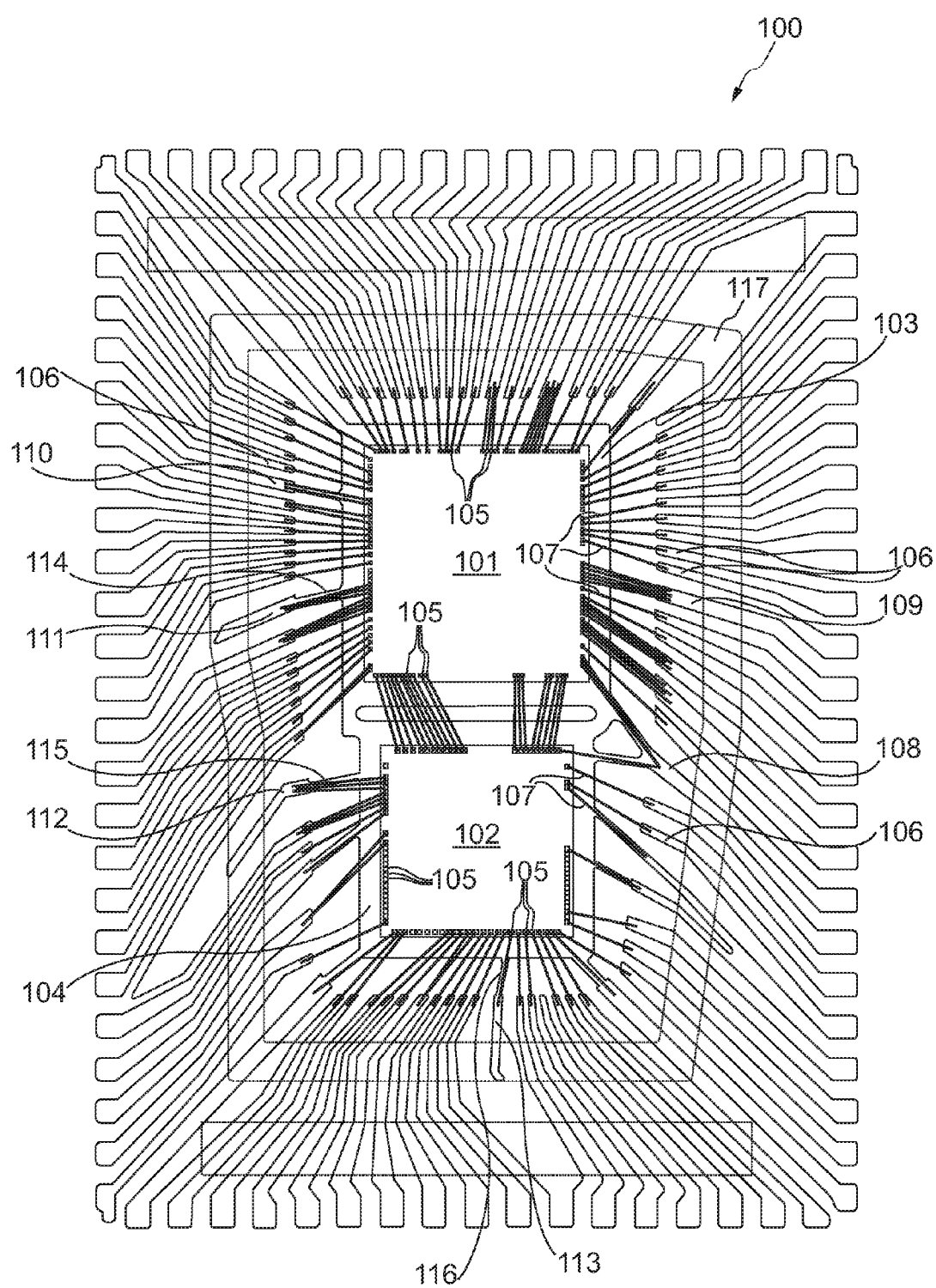
FIG. 1 schematically illustrates a leadframe structure.

The illustration in the drawing is schematically. In different drawings, similar or identical elements are provided with the same reference signs.

In the following, referring to FIGS. 1 to 3, a leadframe structure 100 and an electronic package is described.

FIG. 1 schematically shows a top view of a leadframe structure 100 having attached two chips or dies 101 and 102 to it. The dies 101 and 102 are attached, e.g. glued, to die-pads 103 and 104, respectively. The dies 101 and 102 comprise a plurality of terminals 105, which are connected to a plurality of bonding areas 106 by respective bonding wires 107. Some of the plurality of bonding areas are formed as fused leads, i.e. are connected to the die-pad and thus to ground. In particular, some of the fused leads 108, 109 and 110 are connected to external ground as well. Preferably, also corner leads are arranged in the corners of the leadframe structure that are used for mechanically supporting the leadframe itself. Some of the fused leads are formed as dummy fused leads 111, 112, and 113, i.e. fused leads which are not connected to external ground. These dummy fused leads 111, 112, and 113 are connected to the die-pads by barrier areas 114, 115, and 116, respectively. Furthermore, a clamping area 117 is schematically indicated in FIG. 1, which supports the leadframe and the bonding areas during bonding of the bonding wires.

Figure 2A:
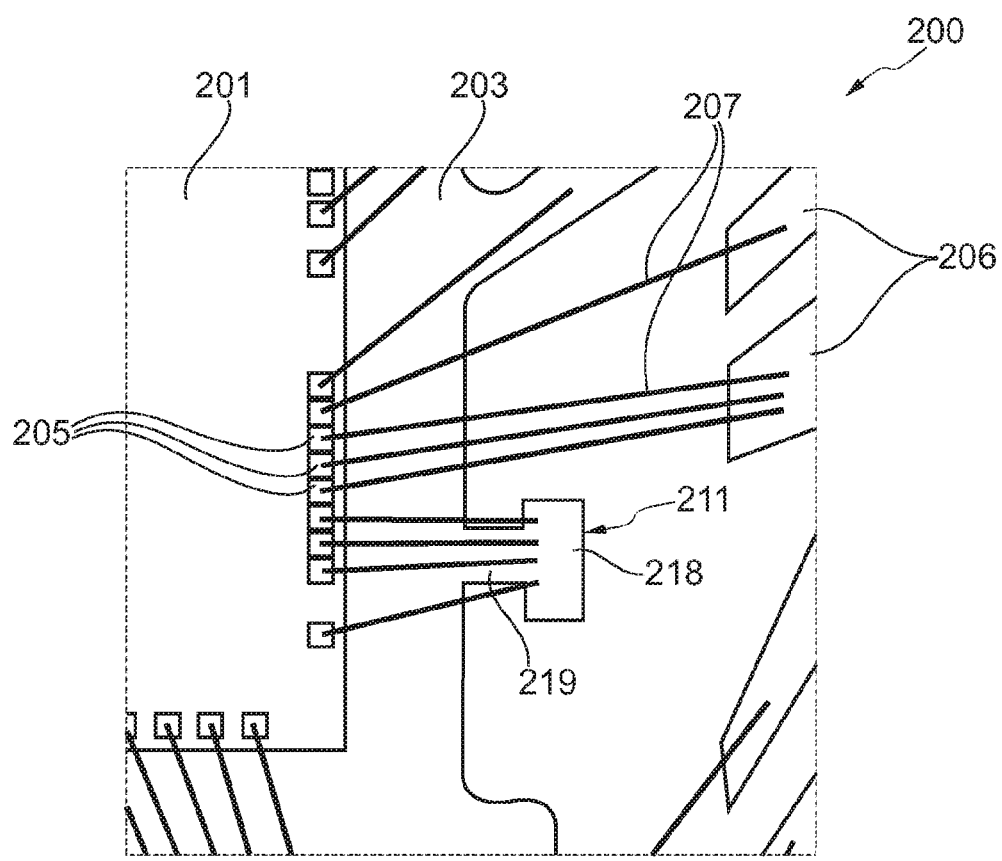
FIG. 2 schematically illustrates a detail of the leadframe structure shown in FIG. 1.

FIG. 2A schematically shows a top view of a detail of a leadframe structure 200. A die 201 is attached to a die-pad 203 of the leadframe structure 200. The die 201 comprises a plurality of terminals 205, which are connected to a plurality of bonding areas 206 by respective bonding wires 207. Some of the plurality of bonding areas are formed as fused leads, i.e. are connected to the die-pad and thus to ground. In particular, a dummy fused lead 211 is depicted in greater detail in FIG. 2A. The bonding area 218 of the fused link 211 is contacted to the die-pad 203 by a barrier area 219 which is relative small and stout.

Figure 2B:
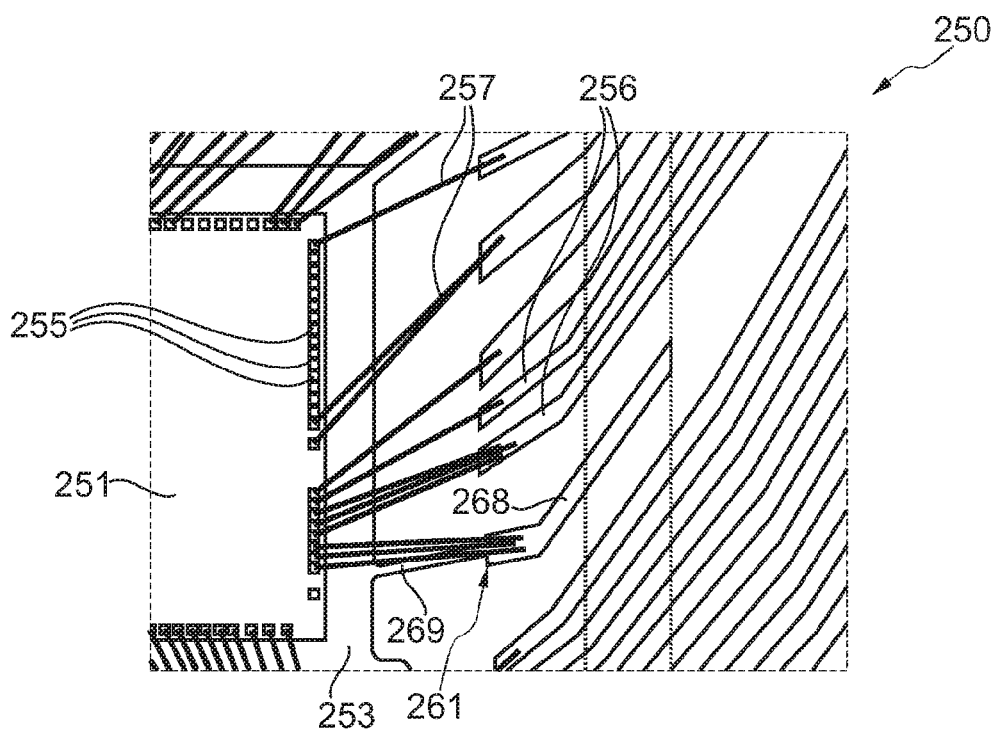

FIG. 2B schematically shows a top view of a detail of a leadframe structure 250. A die 251 is attached to a die-pad 253 of the leadframe structure 250. The die 251 comprises a plurality of terminals 255, which are connected to a plurality of bonding areas 256 by respective bonding wires 257. Some of the plurality of bonding areas are formed as fused leads, i.e. are connected to the die-pad and thus to ground. In particular, a dummy fused lead 261 is depicted in greater detail in FIG. 2B. The bonding area 268 of the fused link 261 is contacted to the die-pad 253 by a barrier area 269. Compared to the barrier area 218 shown in FIG. 2A the barrier area shown in FIG. 2B is longer and narrower, i.e. may be called an elongated barrier area. The longer a shape of the barrier area 269 may ease that the fused leads may be supportable by a clamping area 267 during the bonding of bonding wires.

FIG. 3 schematically illustrates growing of a delamination. In particular, FIG. 3 schematically shows a top view of a detail of a leadframe structure 300. A die 301 is attached to a die-pad 303 of the leadframe structure 300. The die 301 comprises a plurality of terminals 305, which can be connected to a plurality of bonding areas 306 by bonding wires. In FIG. 3A one bonding area is formed as a fused lead 311, i.e. is connected to the die-pad and thus to ground. The bonding area 318 of the fused link 311 is contacted to the die-pad 303 by a barrier area 319 which is, as shown in FIG. 2B, long and narrow. Furthermore, a clamping area 317 is schematically indicated in FIG. 3, which supports the leadframe and the bonding areas during bonding of the bonding wires. In FIG. 3A a situation is shown in which the delamination process starts from the edge of the die 301. The delamination is schematically indicated by the dots 320. In FIG. 3B the situation of delamination growth is schematically depicted, i.e. the delamination process 320 is proceeded further up to the edge of the die-pad 303. In particular, the long and narrow barrier area acts as an efficient barrier for the growth of the delamination.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A leadframe structure for an electronic package, the leadframe structure comprising:
 a die-pad configured and arranged for die attachment,
 a bonding area and
 a barrier area having a barrier structure connecting the die-pad and the bonding area and configured and arranged with a length and width, at a connection between the barrier and the die-pad, that mitigates the delamination of a moulding compound from the barrier as the moulding compound delaminates from a portion of the die-pad adjacent the connection between the barrier and the die pad.

2. The leadframe structure according to claim 1, wherein the barrier area is formed by a barrier structure having a length which is at least two times the width of the barrier structure.

3. The leadframe structure according to claim 1, wherein the bonding area includes a fused lead.

4. The leadframe structure according to claim 3, wherein the fused lead includes a dummy fused lead.

5. The leadframe structure according to claim 1, further comprising:
 a clamping area configured and arranged for clamping during a bonding step.

6. An electronic package, comprising:
 a leadframe structure according to claim 1, and
 a die wherein the die is attached to the die-pad, and wherein the die is further electrically contacted to the bonding area.

7. The electronic package according to claim 6, further comprising:
 wherein the moulding compound at least partially covers the leadframe structure and the die.

8. The leadframe structure of claim 1, wherein the barrier structure is configured and arranged to prevent a delaminated portion of the moulding compound on the die-pad adjacent the barrier structure from further delaminating a portion of the moulding compound on the barrier adjacent the die-pad.

9. A leadframe structure for an electronic package, the leadframe structure comprising:
 a die-pad;
 a bonding area spaced apart from the die-pad and configured and arranged for connecting to the die-pad via a bondwire; and
 a barrier connecting the die-pad and the bonding area and configured and arranged to, at the connection to the die-pad, mitigate thermomechanical stress at the barrier, relative to thermomechanical stress that causes delamination of the moulding compound from the die-pad immediately adjacent the barrier.

10. The leadframe structure of claim 9, wherein the barrier is configured and arranged to prevent a delaminated portion of the moulding compound on the die-pad adjacent the barrier structure from further delaminating a portion of the moulding compound on the barrier adjacent the die-pad.

11. The leadframe structure according to claim 9, wherein the barrier is configured and arranged with length and width that mitigate thermomechanical stress at the barrier, the width being less than half a width of the bonding area at a connection between the bonding area and the barrier, and the length being at least four times the width of the barrier.

12. The leadframe structure according to claim 9, wherein the barrier, the die-pad, and the bonding area are formed of the same type of material.

13. The leadframe structure according to claim 9, further including a clamping area arranged around the die-pad and configured to support leads during wire bonding to the bonding area.

14. An apparatus comprising:
 a leadframe structure including a die-pad, a bonding pad spaced apart from the die-pad, and a barrier connected between the die-pad and the bonding pad
 a die secured to the die-pad and connected to the bonding pad via at least one bondwire;
 a moulding compound encapsulating the die, the at least one bonding wire and the leadframe structure, the moulding compound being configured and arranged to support the bond wire in response to removal of the leadframe structure;
 the barrier having a barrier structure connected to the die-pad, the barrier structure having a length and width at a connection of the barrier to the die-pad that is configured and arranged to mitigate the growth of delamination of the moulding compound from the die-pad adjacent the barrier structure to the barrier.

15. The apparatus of claim 14, wherein the barrier structure is configured and arranged to prevent a delaminated portion of the moulding compound on the die-pad adjacent the barrier structure from further delaminating a portion of the moulding compound on the barrier adjacent the die-pad.

16. The apparatus of claim 14, wherein the barrier structure has a length that is at least four times a width of the barrier structure, the width being less half a width of the bonding pad.

17. The apparatus according to claim 14, wherein the barrier structure, the die-pad and the bonding pad are formed from a metallic conductor.

18. The apparatus according to claim 14, further including a clamping structure arranged around the die-pad and configured to support leads during wire bonding to the bonding area.

19. The apparatus according to claim 14, wherein the barrier structure is configured and arranged to, at the connection to the die-pad, mitigate delamination of a moulding compound from the barrier, relative to delamination of the moulding compound from the die-pad immediately adjacent the barrier.

* * * * *